United States Patent
Manning

(10) Patent No.: US 7,983,108 B2
(45) Date of Patent: Jul. 19, 2011

(54) ROW MASK ADDRESSING

(75) Inventor: Troy A. Manning, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 362 days.

(21) Appl. No.: 12/185,709

(22) Filed: Aug. 4, 2008

(65) Prior Publication Data

US 2010/0027367 A1    Feb. 4, 2010

(51) Int. Cl.
*G11C 8/00* (2006.01)
(52) U.S. Cl. .................... 365/230.06; 365/230.08
(58) Field of Classification Search .......... 365/230.06, 365/230.08, 149
See application file for complete search history.

(56) References Cited

U.S. PATENT DOCUMENTS

| 5,875,143 | A | 2/1999 | Ben-Zvi |
| 6,215,714 | B1 | 4/2001 | Takemae et al. |
| 7,058,863 | B2 * | 6/2006 | Kouchi et al. ............ 714/718 |
| 7,099,207 | B2 | 8/2006 | Sohn et al. |
| 7,684,258 | B2 * | 3/2010 | Kanda et al. ............ 365/189.03 |
| 2010/0027367 | A1 * | 2/2010 | Manning ............ 365/230.06 |

* cited by examiner

*Primary Examiner* — Anh Phung
(74) *Attorney, Agent, or Firm* — Schwegman, Lundberg & Woessner, P.A.

(57) ABSTRACT

Electronic apparatus, systems, and methods may operate structures to access a portion of a row of a memory array without accessing the entire row. Additional apparatus, systems, and methods are disclosed.

17 Claims, 10 Drawing Sheets

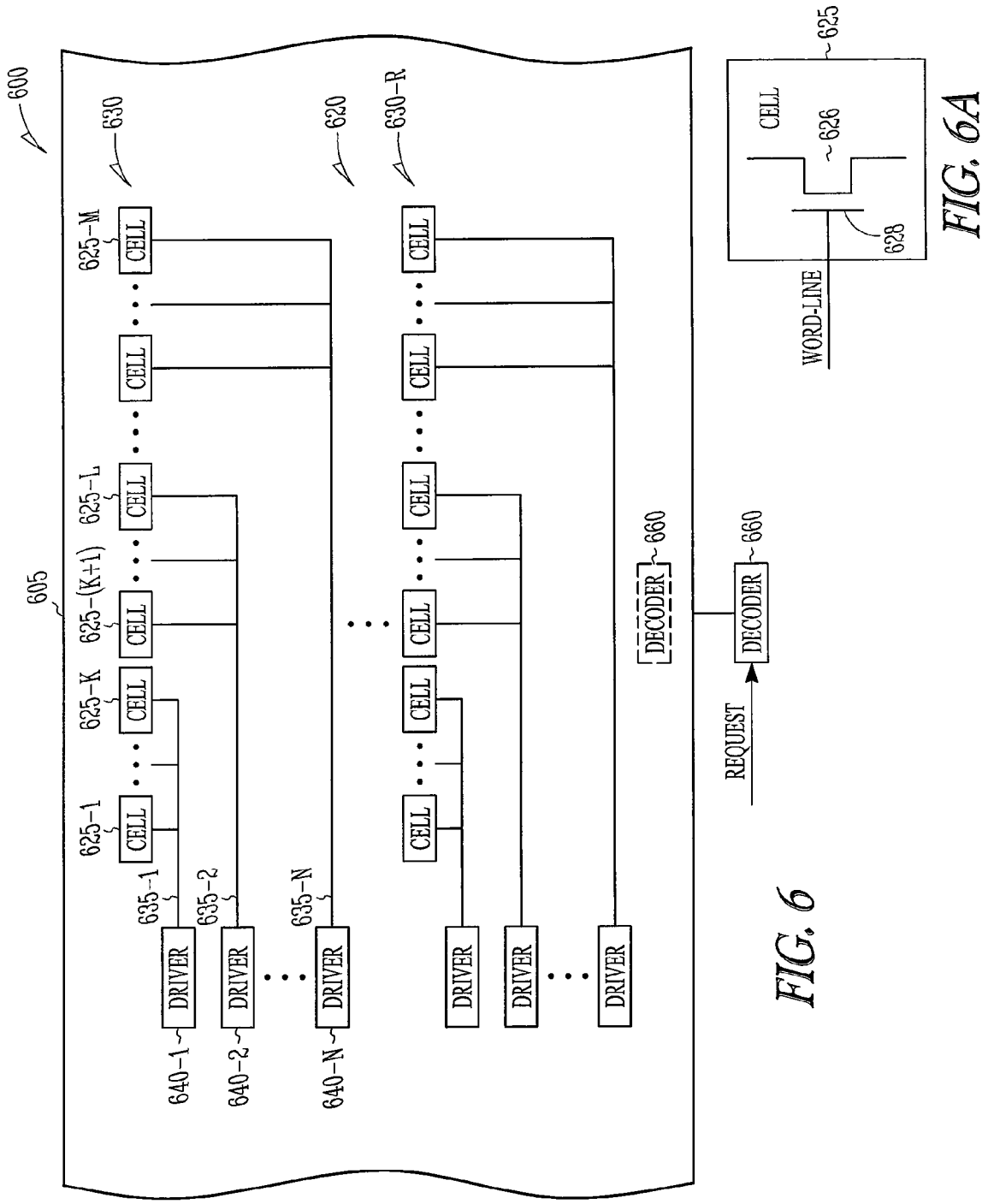

ary embodiments of the invention.

ROW MASK ADDRESSING

BACKGROUND

Operating electronic devices includes the consumption of power. Consumption of power can lead to depletion of power supply resources, increased operational costs, and performance degradation associated with heating and other effects associated with current flows in the electronic devices. In complex devices, such as memories, there exist numerous operational current paths.

BRIEF DESCRIPTION OF THE DRAWINGS

FIG. 6 illustrates a memory device arranged to selectively access a portion of memory cells of a row of a memory array without accessing all the memory cells on row, according to various embodiments of the invention.

FIG. 6A illustrates a access-line coupled to a gate of a transistor in a memory cell of a memory array, according to various embodiments of the invention.

DETAILED DESCRIPTION

The following detailed description refers to the accompanying drawings that show, by way of illustration, various embodiments of the present invention. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
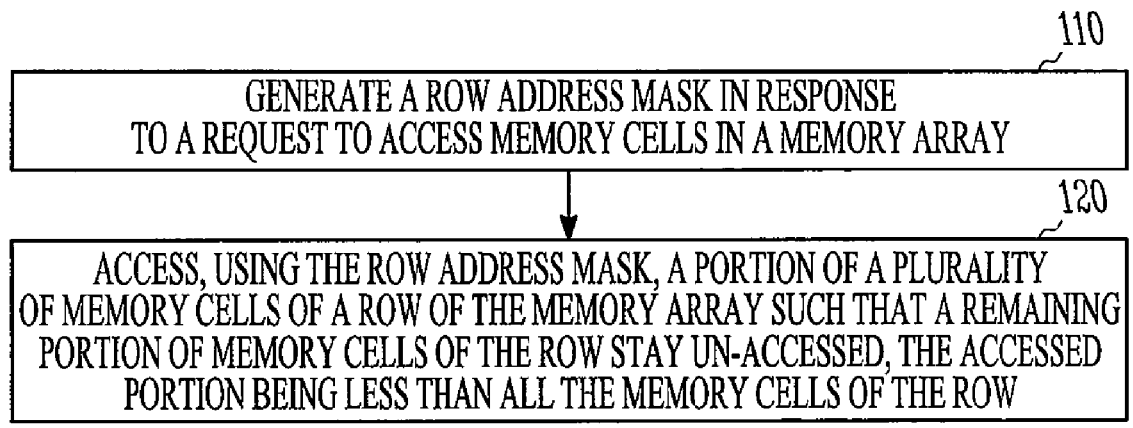
FIG. 1 illustrates features of a method that includes accessing portions of memory cells of a row in a memory array without accessing all the memory cells of the row, according to various embodiments of the invention.

FIG. 1 shows features of a method that includes accessing portions of memory cells of a row in a memory array without accessing all the memory cells of the row, according to various embodiments of the invention. Herein, access can mean, for example, to activate, to enable, to fire, or to turn on. A memory array is a systematic arrangement of memory cells that can be logically arranged according to a plurality of parameters. Herein, a portion can mean for example, a section, segment, group, sub-array, or part. In various embodiments, each memory cell can be addressed according to values of two parameters. The two parameters may be referred to as a row and a column. A memory cell may be logically located in the memory array indexed uniquely according to a value for a row and a value for a column. Rows and columns are not limited to a particular physical orientation or linear relationship. Herein, a row of a memory array is a group of memory cells that can be accessed at the same time by a decoder assigned to row values such that the group of memory cells is the maximum number of memory cells that can be accessed at the same time by the row decoder for a given value for the row. Herein, a column of a memory array is a group of memory cells that can be accessed at the same time by a decoder assigned to column values such that the group of memory cells is the maximum number of memory cells that can be accessed at the same time by the column decoder for a given value for the column.

At 110, a row address mask is generated in response to a request to access memory cells in a memory array. The row address mask may be generated as an address for one or more memory cells of a row to be blocked from receiving an access signal for the entire row. These addressed memory cells may be less than all the memory cells of the row. The address may be provided as bits in addition to the row address for the entire row.

The access signal for the entire row may be generated from a row address decoder, based on the row address, and placed on a global access-line for the memory array, with the additional bits used to provide the blocking function. In various embodiments, an access-line may be realized as a word-line. Alternatively, the row address mask may be generated as an address for one or more memory cells of a row, but less than all the memory cells of the row, to be accessed. In various embodiments, with the row address mask generated in response to request to access data, the row address mask is created in substantially real-time, that is, the row address mask is created when requested.

At 120, using the row address mask, a portion of a plurality of memory cells of a row of the memory array are accessed such that a remaining portion of memory cells of the row stay un-accessed, the accessed portion being less than all the memory cells of the row. The accessed portion may be accessed using the row mask address to block local access-lines for a row from receiving a signal that accesses the memory cells coupled to these local access-lines, where the local access-lines are one or more, but less than all, of the local access-lines associated with a given row.

With each row of a memory array being in a one-to-correspondence with a global access-line, the global access-line may provide a signal to all the memory cells for the row through a plurality of drivers. With each driver assigned to one or more, but not all, memory cells of the row, the portion of the access-line for the row controlled by each driver provides a local access-line. Each local access-line is coupled to one or more memory cells. Each local access-line may be coupled to a gate of a transistor in the memory cell. The generated row address mask allows the signal accessing the row to be blocked from turning on the drivers for the local access-lines corresponding to the specified portions of the access-line. With the drivers not turned on, the corresponding gates of transistors do not receive the appropriate signal to access the corresponding memory cell in response to the request to access memory cells. Alternatively, the memory may be arranged such that the row address mask provides an address of the local access-lines to be accessed for a requested memory access.

In an embodiment, a row address mask correlated to a plurality of local access-line drivers corresponding to a row to be accessed is used such that one or more local access-line drivers of the plurality of local access-line drivers are not turned on when one or more other of the local access-line drivers for the row are turned on in response to a memory access request. In an embodiment, a portion of memory cells of a row of a memory array is accessed using a row address mask by turning on a first set of local access-line drivers with a second set of local access-line drivers remaining off in response to a request to access memory locations on the row, where both the first set and the second set of local access-line drivers correspond to the row. The number of local access-line drivers remaining off may be larger in number than the number of local access-line drivers that are turned on.

In various embodiments, turning on portions of a row without turning on the complete row allows for a reduction in the amount of power that is consumed to access memory cells in the memory. This partial selection of a row allows for more efficient use of power in access operations, such as read, write, and refresh operations, than conventional memories such as DRAMs in which a full access-line is turned on across all columns to access a portion of the row. In various embodiments, a row address mask provides another dimension to row access operations. In such embodiments, any portion or portions of a row may be turned on, which can also be equivalently referred to as being fired, activated, or accessed, using a set of addresses in addition to the row address for the selected row. The additional set of addresses may be set orthogonal to the rows, where the function of the additional addresses is to mask certain row portions from turning on. This masking operation creates sub-pages of addressable space, which allows a memory, such as a DRAM, to significantly reduce current usage for many types of memory array access, relative to conventional memories of the same type.

For example, if an access operation only reads from a single column or writes to a single column, a minimal portion of the row may be fired ($\frac{1}{8}^{th}$, $\frac{1}{16}^{th}$, or $1/N^{th}$ depending on the number of columns for a given architecture), saving a significant portion of access current. If half a page is selected for access, multiple portions of the row may be fired. If a whole page is to be accessed or a row refresh is to be executed, the entire row may be fired.

Figure 2:
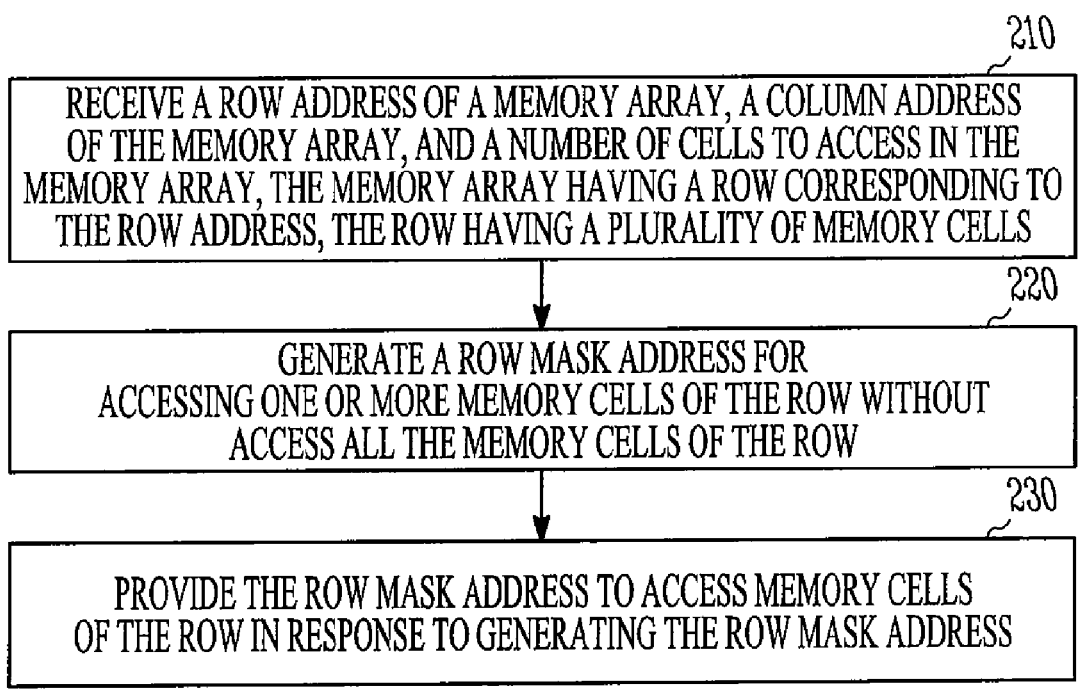
FIG. 2 illustrates features of a method that includes generating a row mask address to access one or more memory cells of a row of a memory array without accessing all the memory cells of the row, according to various embodiments of the invention.

FIG. 2 illustrates features of a method that includes generating a row mask address to access one or more memory cells of a row of a memory array without accessing all the memory cells of the row, according to various embodiments of the invention. At 210, a row address and a column address of a memory array along with a number of cells to be accessed in the memory array are received, where the memory array has a row corresponding to the row address and the row has a plurality of memory cells. The number of cells to be accessed may be provided as an amount of data desired. The amount of desired data may be requested as a number of bytes ranging from 1 byte to a large number of bytes. The number of cells per byte requested may depend on the memory architecture. The largest number of bytes may depend on the memory array size and/or application with which the memory array is associated. The request for the access may be received by a row mask generator. The row mask generator may be configured separate from the memory and separate from a processor that initiates the request. Alternatively, the row mask generator may be located on an integrated circuit die with the memory and/or a processor.

At 220, a row mask address for accessing one or more memory cells of the row without accessing all the memory cells of the row is generated. A row mask generator decodes a request for access to a memory array and generates a row address mask that provides addresses of one or more memory cells of the row to be blocked from being accessed when accessing other memory cells of the row. Alternatively, a row mask generator decodes a request for access to a memory array and generates a row address mask that provides addresses only for one or more memory cells of the row to be accessed.

At 230, after generating the row mask address, the row mask address to access memory cells of the row is provided in an appropriate format. For a row mask generator configured external to the memory, the appropriate format may include a global row address and column address along with a row mask address, where the memory is arranged to receive the global addresses and the row mask address. For a row mask generator configured external to the memory, the appropriate format may include a column address along with a row mask address.

The memory may be arranged to receive the column addresses and the row mask address identifying local access-lines. The identified local access-lines may be configured to receive an access signal or to be blocked from receiving such a signal, depending on the architecture with which the memory is constructed. The local access-lines may be correlated to drivers that provide the signals to the local access-lines. In various embodiments, with the row mask address provided in response to a request to access data, provisioning of the row mask address is provided substantially in real-time, that is, the row mask address is created when requested.

Figure 3:
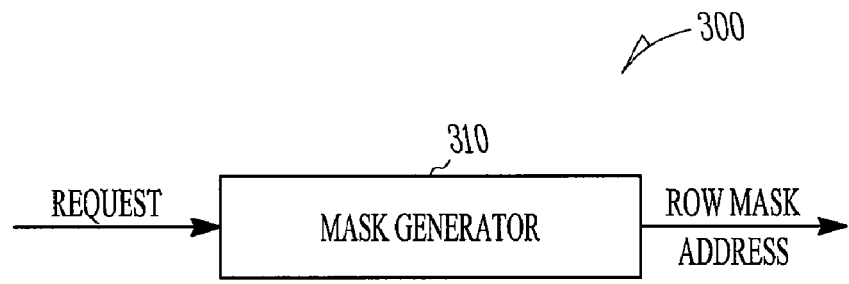
FIG. 3 shows a block diagram of an apparatus having a mask generator to selectively access a portion of memory cells of a row of a memory array without accessing all the memory cells of the row, according to various embodiments of the invention.

FIG. 3 shows a block diagram of an apparatus 300 having a mask generator 310 to selectively access a portion of memory cells of a row of a memory array without accessing all the memory cells of the row, according to various embodiments. Mask generator 310 may be configured to receive a request to access memory cells in a memory array of a memory and to generate a row mask address to the memory. Mask generator 310 can act as a request decoder, whose output includes a row mask address. The request may include a row address and the generated row mask address may include an address orthogonal to the row address. The request may include a row address and one or more column addresses.

The row mask address can be correlated to a quantity of memory cells to access. The row mask address may be generated as an address of a portion of a row, where the portion is less than the row in its entirety. The generated row mask address may be indicative of a set of portions of a row of the memory array, corresponding to the row address, that are not to be accessed while other portions of the row, corresponding to the row address, are to be accessed. Alternatively, the generated row mask address may be indicative of a set of portions of a row of the memory array, corresponding to the row address, to be accessed while other portions of the row, corresponding to the row address, are to remain un-accessed.

Figure 4:
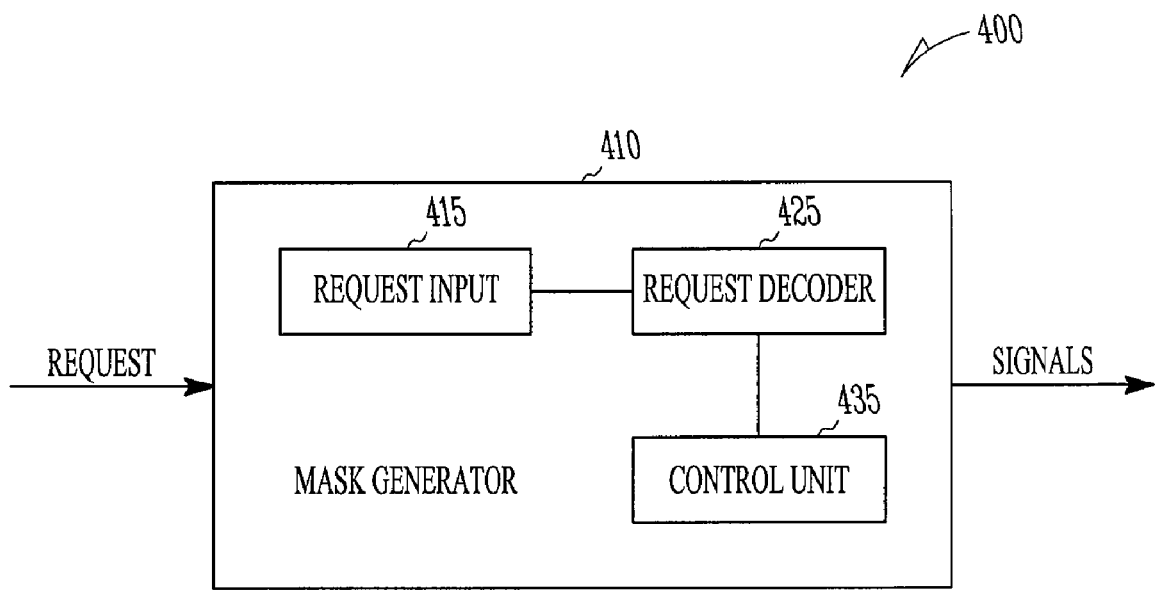
FIG. 4 shows a block diagram of an apparatus having a mask generator to selectively access a portion of memory cells of a row of a memory array without accessing all the memory cells of the row, according to various embodiments of the invention.

FIG. 4 shows a block diagram of an apparatus 400 having a mask generator 410 to selectively access a portion of memory cells of a row of a memory array without accessing all the memory cells of the row, according to various embodiments. Mask generator 410 is configured to operatively access a portion of memory cells of a row of a memory array of a memory device without accessing all the memory cells of the row. Mask generator 410 includes a request input 415 to receive a request to access memory cells in the memory array, a request decoder 425 arranged to determine the portion of memory cells of the row to access in response to the request, and a control unit 435 to regulate signals to the memory array to access the memory cells of the row. The request received by request decoder 425 may include a row address, a column address, and a quantity of cells to access. The request may be received from a controller such as, but not limited to, a processor.

Control unit 435, based of a row address and one or more column addresses extracted from the request, may provide a signal to one or more local access-lines assigned to the row corresponding to the row address. One or more signals may be used to access a portion of memory cells of the row such that non-accessed memory cells of the row remain non-accessed while the portion of memory cells is accessed. In various embodiments, control unit 435 outputs the signals as a row mask address for a memory array. Alternatively, control unit 435 may be configured to pass one or more signals directed to control a portion of memory cells of a row in a memory device to block access of these memory cells, while other memory cells of the row are accessed. Alternatively, control unit 435 may be configured to generate the signal so as to be directed only to the one or more access-lines of memory signals selected for access.

Apparatus 400 may include the memory device to which mask generator 410 provides signals. The signals may be used to selectively access a portion of memory cells of a row of a memory array of the memory device without accessing all the memory cells of the row. Mask generator 410 may be located exterior to the memory device. Mask generator 410 may be coupled to the memory device by various mechanisms. In various embodiments, row mask generators may be implemented to allow a memory controller to be more tightly coupled to central processing unit(s) (CPU(s)) in a system or absorbed directly into a CPU.

Figure 5A:
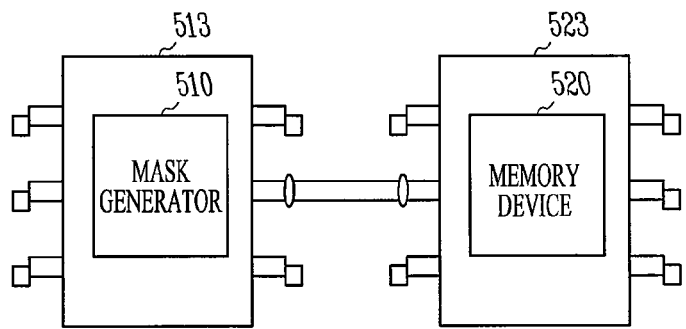
FIGS. 5A-5C illustrate example arrangements of a mask generator with a memory device, according to various embodiments of the invention.
Figure 5B:
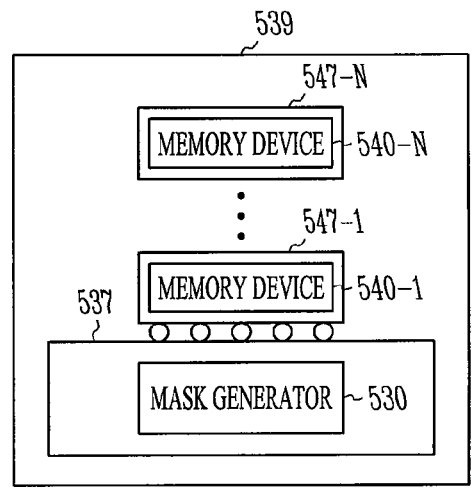
Figure 5C:
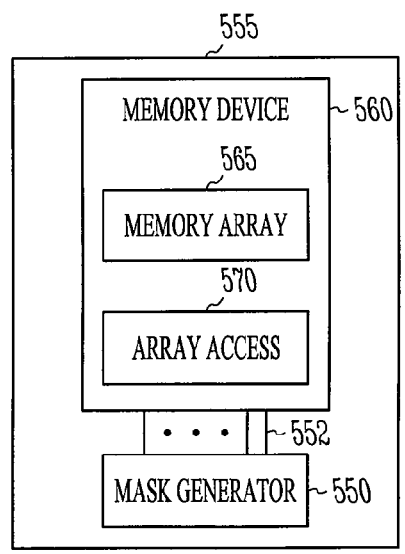

FIGS. 5A-5C illustrates example arrangements of a mask generator with a memory device, according to various embodiments. FIG. 5A shows mask generator 510 in a package 513 coupled to memory device 520 by a conductive connection to one or more pins of memory device 520 in package 523. Mask generator 510 may be configured in package 513 as one of a number of components of package 513 that are used to handle communications between a processor, memory device 520, other memory devices, and various interfaces. The communications may handle memory requests to the various memories.

FIG. 5B shows mask generator 530 coupled to one or more memory devices 540-1 . . . 540-N by a conductive connections. Memory devices 540-1 . . . 540-N may be structured on dies 547-1 . . . 547-N, respectively, with mask generator 530 on another die 537. Mask generator 530 and memory devices 540-1 . . . 540-N may be disposed in the same integrated circuit packaging 539.

FIG. 5C shows a mask generator 550 disposed on the same die 555 as a memory device 560. Conductive lines 552 couple mask generator 550 to array access 570 of memory device 560 to enable accessing memory array 565. Die 555 may be a single die in a package or may be arranged as part of a group of dice in an integrated circuit package.

FIG. 6 illustrates a memory device 600 arranged to selectively access a portion of memory cells of a row of a memory array without accessing all the memory cells on row, according to various embodiments. Memory device 600 includes an array 620 of memory cells on a substrate 605 with a plurality of memory cells 625-1 . . . 625-M of a row 630 of array 620, a plurality of access-lines 635-1, 635-2 . . . 635-N assigned to row 630 of array 620, and a plurality of drivers 640-1, 640-2 . . . 640-N to access memory cells 625-1 . . . 635-M of row 630. Each access-line 635-1, 635-2 . . . 635-N is coupled to one or more memory cells on row 630 to operatively access the one or more memory cells without accessing other memory cells on row 630. For example, access-line 635-1 may be accessed to access memory cells 625-1 . . . 625-K without accessing cells 625-(K+1) . . . 625-M. Depending on the memory access operation, all memory cells 625-1 . . . 625-M may be accessed by accessing all access-lines 635-1 . . . 635-N assigned to row 630.

Each driver 640-1, 640-2 . . . 640-N corresponds to a different access-line 635-1, 635-2 . . . 635-N coupled to row 630 to provide an access signal to its corresponding access-line 635-1, 635-2 . . . 635-N. As shown in FIG. 6A, a given access-line, such as one of access-lines 635-1, 635-2 . . . 635-N, may be coupled to a gate 628 of a transistor 626 of each cell 625 corresponding to the given access-line, according to various embodiments.

Memory device 600 may be constructed with memory cells 625-1 . . . 625-M on row 630 effectively partitioned into groups, where each group is coupled to a different one of the access-lines 635-1, 635-2 . . . 635-N assigned to row 630. Each group may have the same number of memory cells of row 630. Alternatively, the number of memory cells of row 630 for each group may vary. The number of memory cells in a group may range from one memory cell of row 630 to all but one memory cell of row 630.

FIG. 6 shows a block diagram of memory cells, access-lines, and drivers, whose arrangement in memory device 600 is not limited by the relative positions of these features as shown on FIG. 6. For example, a driver may be arranged on either side of the corresponding group of one or more memory cells that the driver accesss, such that the spacing on the die for memory device 600 is larger between the groups of partitioned memory cells than between two memory cells in the same group.

A decoder 660 may be configured to receive a request and to select access-lines assigned to row 630 to access a portion of the memory cells of row 630 without accessing all the memory cells 625-1 . . . 625-M of the row 630. Memory devices may be arranged in conjunction with decoder 660 to select one of the access-lines assigned to row 630 to access a portion of the memory cells 625-1 . . . 625-M of row 630 without accessing all the memory cells of row 630. The selected access-line may be accessed to access one memory cell or to access a plurality of memory cells less than the total number of memory cells on row 630. Memory device may be arranged in conjunction with decoder 660 to select a plurality of the access-lines assigned to row 630 to access a portion of the memory cells 625-1 . . . 625-M of row 630 without accessing all the memory cells of row 630. Decoder 660 may be located off of substrate 605. Alternatively, decoder 660 may be located on substrate 605.

Other rows in memory array 620 may be configured in a similar manner as row 630. Memory array 620 may include a plurality of rows 630 . . . 630-R. Similar to row 630, each row has a plurality of access-lines, where each access-line of the respective row is coupled to one or more memory cells on the respective row to operatively access the one or more memory cells without accessing other memory cells on the respective row. Each plurality of access-lines of the respective rows is operable to selectively access a sub-page of addressable space of memory device 600.

Figure 7:
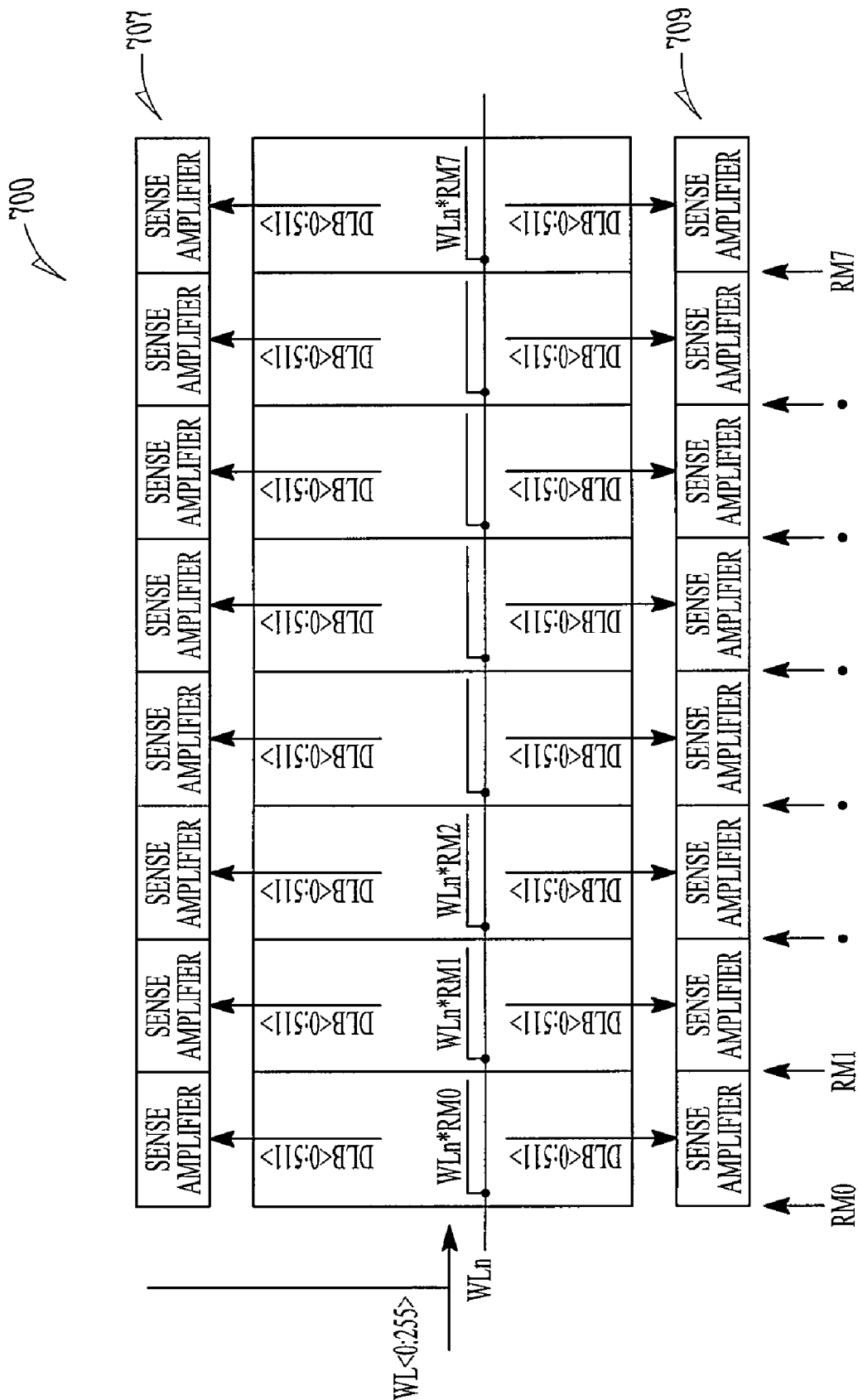
FIG. 7 shows a representation of a memory device using additional row address bits to selectively access a portion of memory cells of a row of a memory array without accessing all the memory cells of the row, according to various embodiments of the invention.

FIG. 7 shows a representation of a memory device 700 using additional row address bits to selectively access a portion of memory cells of a row of a memory array without accessing all the memory cells of the row, according to various embodiments. As an example, memory device 700 is shown as a 2M (2,048,000 bits) core memory device having a memory array with 256 global access-lines, where each access-line is partitioned into 8 local access-lines. A row address is used to select access-line, $WL_n$, and a row mask address provides bits RM0-RM7 to selectively access the memory cells in each respective portion. RM0-RM7 bits allow one or more portions to be selected for access. With RM0 set to access a first portion of memory cells, RM1-RM7 are provided such that $WL_n*RMx$, x=1, 2, . . . 7 maintains the remaining portions of memory cells corresponding to $WL_n$ un-accessed. With only RM0 set to allow access by accessing global access-line $WL_n$, ⅛ (8000 bits) of the memory cells corresponding to access-line $WL_n$ are active in the access operation. With memory cells corresponding to RMx un-accessed, no current flows through the respective sense amplifiers 707 and 709. Such a configuration reduces power consumption as compared to a corresponding memory type that don't include row address cells to selectively access a portion of memory cells of a row of a memory array without accessing all the memory cells of the row.

Figure 8:
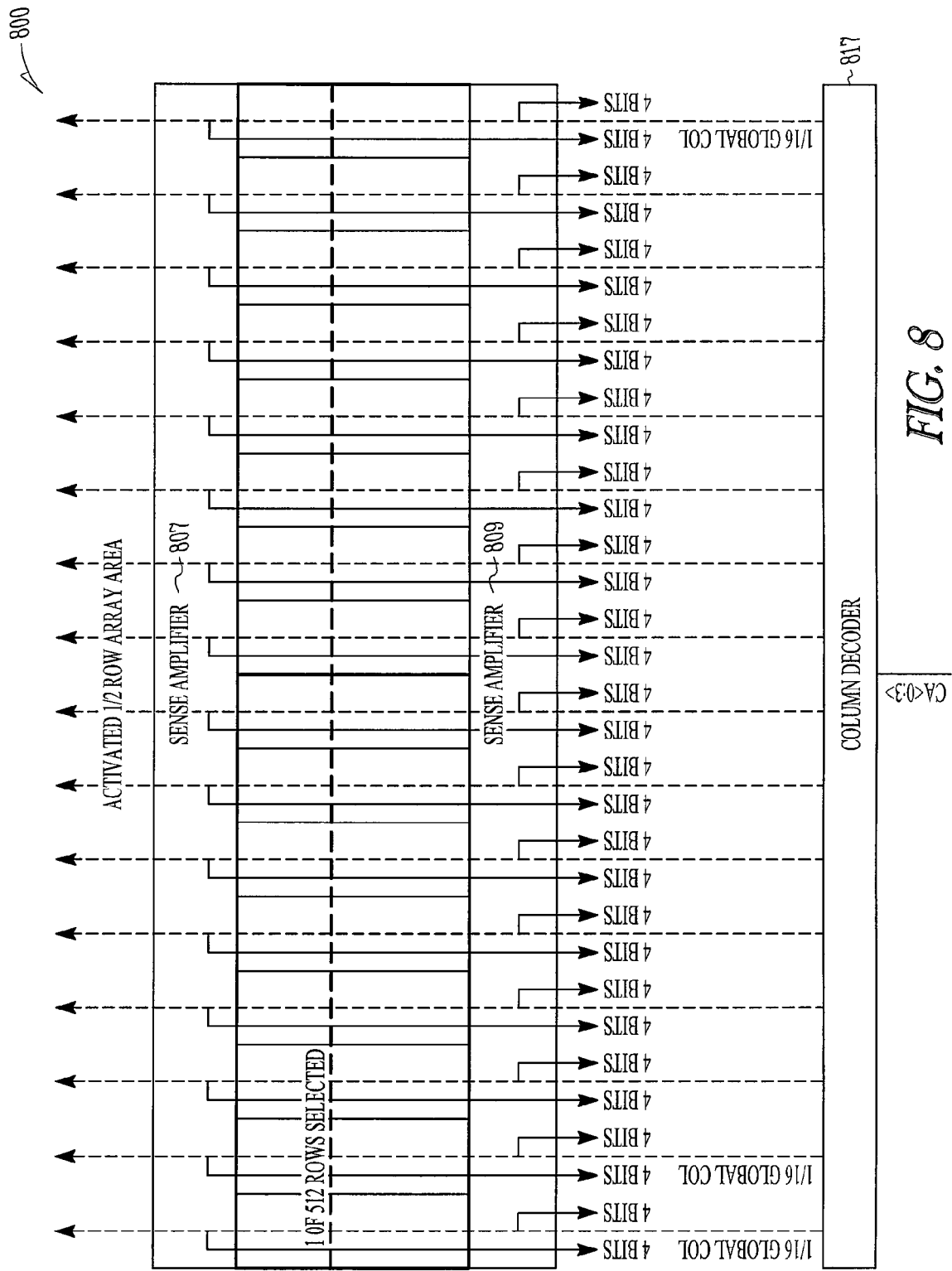
FIG. 8 shows a representation of a memory device having a memory array in which one-half of a selected row is accessed, according to various embodiments, according to various embodiments of the invention.

FIG. 8 shows a representation of a memory device 800 having a memory array in which one-half of a selected row is accessed, according to various embodiments. FIG. 8 shows one of 512 rows selected with one-half of the row accessed. In this case, 8 cells are provided for each one-sixteenth of a global column address provided from column decoder 817. With one-half of the row accessed, one-half of sense amplifiers 807 and 809 operate, which uses less power than when the entire row is accessed. In various embodiments, a memory device includes a memory array with a number of selectable rows, not limited to 512, in which a portion, not limited to one-half, of the row may be accessed without accessing all the row to access memory cells of the row.

Figure 9:
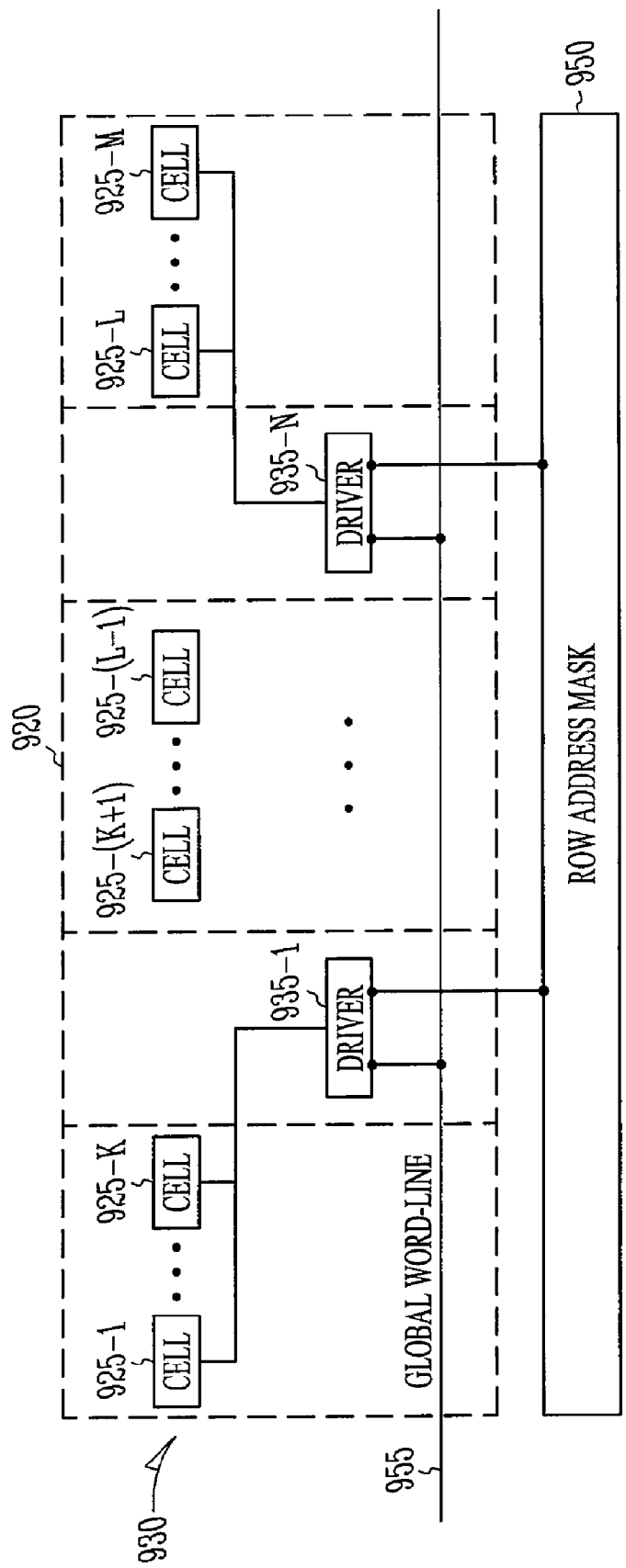
FIG. 9 shows a representation of a memory array indicating a relative position of drivers with respect to corresponding memory cells to selectively access a portion of the memory cells of a row of a memory array without accessing all the memory cells of the row, according to various embodiments of the invention.

FIG. 9 shows a representation of a memory array 920 indicating a relative position of drivers with respect to corresponding memory cells to selectively access a portion of the memory cells of a row of a memory array without accessing all the memory cells of the row, according to various embodiments. Memory array 920 includes a row 930 having memory cells 925-1 . . . 925-K, 925-(K+1) . . . 925-(L−1), 925-L . . . 925-M. These cells may be partitioned into groups forming portions. For example, cells 925-1 . . . 925-K form a portion, cells 925-(K+1) and other cells (not shown) form a portion, cells 925-(L−1) and other cells (not shown) form a portion, and cells 925-L . . . 925-M form a portion. Row 930 is not limited to partitioning into four portions.

Each memory cell in a portion may be spaced substantially at equal distances from one memory cell to another along row 930. The last memory cell of a portion may be spaced from the next memory cell along row 930 that begins another portion at a distance that is greater than the memory cell spacing within its portion. This additional spacing may be used to locate local drivers to access the portions of memory cells individually. Cells 925-1 . . . 925-K are coupled to a driver 935-1, cells 925-(K+1) and other cells (not shown) are coupled to another driver (now shown), cells 925-(L−1) and other cells (not shown) are coupled to another driver (now shown), and cells 925-L . . . 925-M are coupled to a driver 935-N.

The additional spacing may be realized as an increased array spacing in an architecture in which the memory array is not a single contiguous block for all columns accessible in a row. In a memory, such as a DRAM, an array block usually contains a combination of row line ties ("stitches") or cell-plate ties creating a small gap in the memory array. A row line tie is a conductive layer of a memory array to which a portion of the memory cells of a row are connected by their access-lines, in which the portion is less than all the memory cells of the row. A cell plate is the reference terminal common to all DRAM memory cells located in any one sub-array. A cell plate tie is a conductive connection that connects two or more cell plates to each other or a reference voltage. In various embodiments, at these stitches, the spacing may be further expanded for the portions without significantly increasing the overall die size. The increased spacing allows room for either a portion driver or boot nodes enabled by row mask bits from a row address mask generator 950. A boot node is a connection point that when switched to a high voltage is first precharged to some level, usually $V_{DD}$-$V_t$, then "booted" (or boosted) to some level above $V_{DD}$ to provide a drive voltage, where $V_{DD}$ is a supply voltage of the device and $V_t$ is a transistor threshold voltage. A local driver may be realized as an inverter, a level translator, or a boot node. Common buses for the n-channel and p-channel sense amplifiers may also be separated at these gaps with local control for sense amplifier separation. Only small portions of a row line may be turned on based on additional switching or non-switching controlled by the mask bits. The turn on may occur after the main row decoder has fired to access global access-line 955. In various embodiments, row address mask generator 950 is structured with information regarding a particular array architecture built into a given memory design, such that the row address mask generator 950 has information as to where the memory has stitch gaps and local drivers that may be masked.

Row address mask generator 950 may be realized as a portion of a row address buffer and/or decoder that provides additional bits to mask one or more portions of memory cells from being accessed by access of the corresponding global access-line. The additional bits from row address mask generator 950 may be provided to drivers 935-1 . . . 935-N as enable signals. The enable signals may be provided such that an enable signal in combination with an active signal on a global access-line maintains one or more of drivers 935-1 . . . 935-N in an off or un-accessed state. Use of row address mask generator 950 allows dynamic selectability of access to memory cells on row 930. The granularity of the dynamic selectability depends on the number of memory cells per portion along row 930. As the number of selectable memory cells to access in a portion decreases, with the remaining memory cells on row 930 un-accessed, the larger the spacing in the memory array, which increases the array area on the semiconductor die.

With a row address, column addresses, and the amount of data requested, row address mask generator 950 provides information that effectively populates a row address mask such that the memory has information as to where in the memory array 920 data is going to be accessed, such as in a read operation or a write operation. With the row address mask populated, when a row, such as row 930, is fired, a portion of row 930 is masked off and not fired. This process can save a significant portion of power that might normally be wasted. In an embodiment, a row decoder, situated at an end of memory array 920, initiates an access of a row, such as row 930, that traverses the entire stretch of columns by accessing global access-line 955 using a global access-line driver.

With global access-line 955 coupled to a series of hierarchically addressed local access-line drivers 935-1 . . . 935-N, it is the local access-line drivers that actually access the physical row line. Row address mask generator 950 allows a row mask capability such that several of the local access-line drivers may be left un-accessed while accessing the portion of the local access-lines to provide the memory access identified in the request. At the local access-line driver level, an extra few bits of addressing information from row address mask generator 950 localizes which portions of row 930 can be left off from access.

In operation, the row address and the row mask bit or bits are received at substantially the same time. The row mask bits indicate which portion of the row is actually going to be accessed in a read operation or a write operation. When the row identified by the row address is accessed or just prior to accessing the row, the mask bits are set such that the only local access-line drivers accessed are the ones that are involved in the access operation. Since each access-line driver is coupled to a group of memory cells, more memory cells may be accessed than the amount associated with the access operation, as a result of the number of memory cells in a group being greater than one. Though excess memory cells may be accessed, other memory cells not involved in the memory access for the given row remain un-accessed.

To access the memory cells in response to an access request, a global access-line driver is accessed and local access-line drivers turn on, but only the ones corresponding to the request such that a number of local access-line drivers for the given row remain un-accessed. In various embodiments, only a portion, less than all, of the sense amplifiers associated with the given row are accessed. Column access operations and I/O operations may be conducted in a manner similar to the operation of conventional memories.

Various embodiments of structures, as illustrated in FIGS. 1-9 but not limited by these figures, can be constructed in integrated circuits, such as memory devices, using conventional techniques. Various process techniques applied to memory types, which include DRAMs, static random access memory (SRAM), synchronous dynamic random access memory (SDRAM), synchronous graphics random access memory (SGRAM), double data rate dynamic ram (DDR), and double data rate SDRAM, may be employed to fabricate various embodiments for memories as taught herein. Structures of various embodiments may be realized in simulation packages that may be arranged as software, hardware, or a combination of software and hardware packages to simulate various embodiments and/or the operation of various embodiments.

Figure 10:
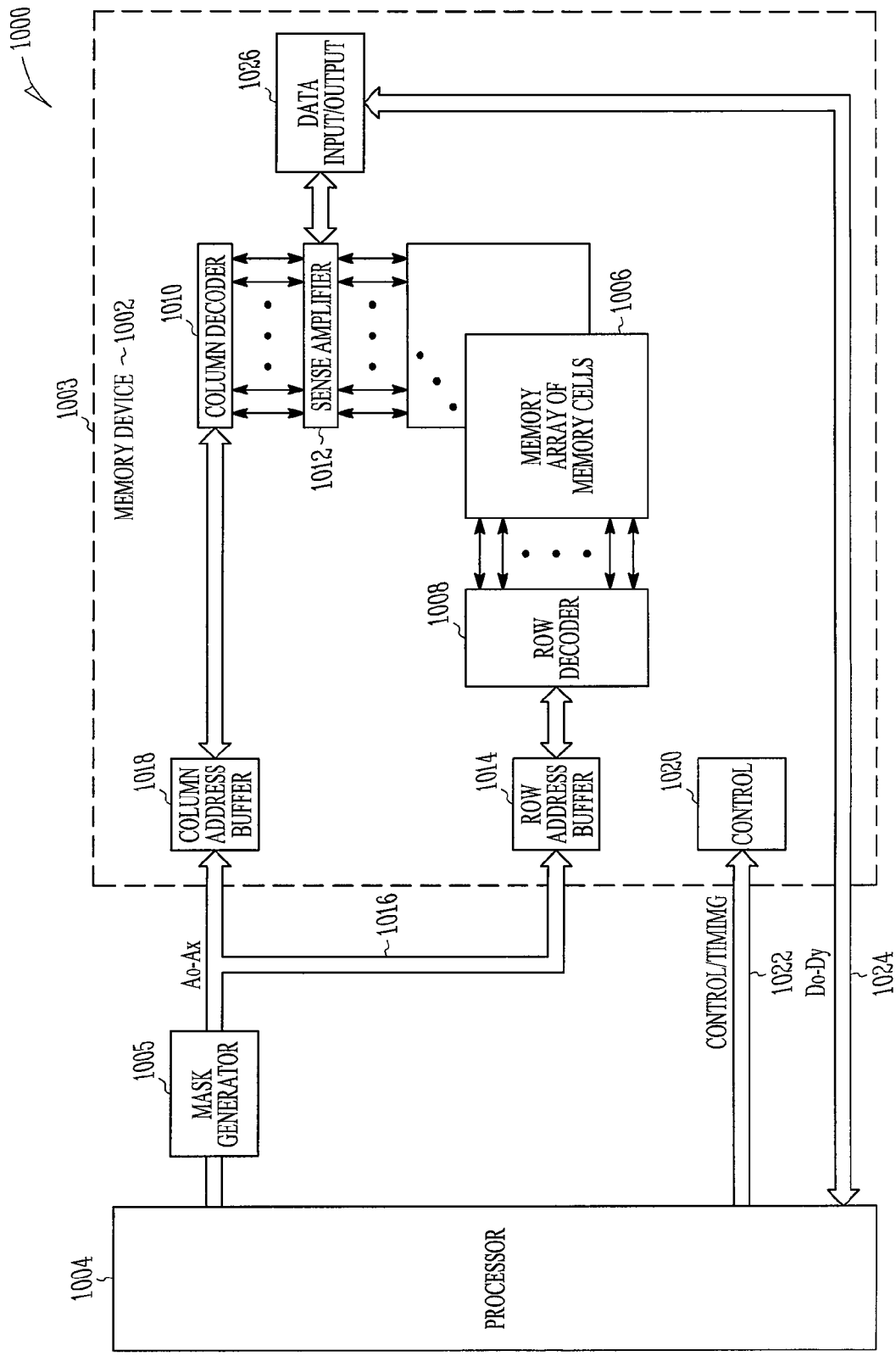
FIG. 10 shows a block diagram of various features of an electronic system, according to various embodiments of the invention.

FIG. 10 shows a block diagram of various features of an electronic system 1000, according to various embodiments of the invention. Electronic system 1000 may be formed in various ways such as coupling the individual components of electronic system 1000 together or integrating the components into one or a number of units using conventional techniques. Electronic system 1000 may include one or more memory devices 1002 coupled to a processor 1004. Memory devices 1002 can be arranged as a number of packaged integrated circuits. Memory devices 1002 may be formed on a substrate 1003. Substrate 1003 may comprise material used in forming a memory device using conventional semiconductor processing techniques. Memory device 1002 includes a plurality of memory cells that are generally arranged in rows and columns in one or more memory arrays of memory cells 1006. Memory device 1002 may also include a row decoder 1008 and a column decoder 1010. Row decoder 1008 operates in combination with a row address buffer 1014 to receive address signals on an address bus 1016 coupled to processor 1004. Accordingly, the address signals received by row decoder 1008 and row address buffer 1014 are operable to direct the memory device 1002 to one or more rows in the array 1006. Similarly, a column address buffer 1018 may be provided that operates in combination with column decoder 1010 to receive the address signals on address bus 1016, so that memory device 1002 may be directed to one or more columns in array 1006.

Electronic system 1000 includes mask generator 1005 configured to receive a request from processor 1004 to access memory cells in memory array 1006 of memory device 1002 and to generate a row mask address to memory device 1002. The row mask address may be arranged as an address of a portion of a row, where the portion is less than the row in its entirety. In various embodiments, mask generator 1005 may be configured and may operate similar to, or identically to, mask generators discussed with respect to FIGS. 1-9. The row mask address may be provided, as mask bits in addition to a row address, to row address buffer 1014 and/or row decoder 1008. Alternatively, with each portion of a row having its own address, mask generator 1005 may be configured to decode the request from processor 1004 and provide an appropriate row portion address to row address buffer 1014 and/or row decoder 1008. Mask generator 1005 may be integrated on substrate 1003 with memory device 1002.

Electronic system 1000 may also include a control unit 1020, which is operable to receive control signals on a control/timing bus 1022 and to interpret various memory access requests. Once memory device 1002 is accessed by receiving suitable control and address signals from processor 1004, data may be communicated to or from memory device 1002 on a data bus 1024, which is coupled to a data input/output unit 1026. Data input/output unit 1026 is operable to read or write the data to array 1006 in combination with a sense amplifier 1012. Data input/output unit 1026 may output data on data lines D0-Dy.

Figure 11:
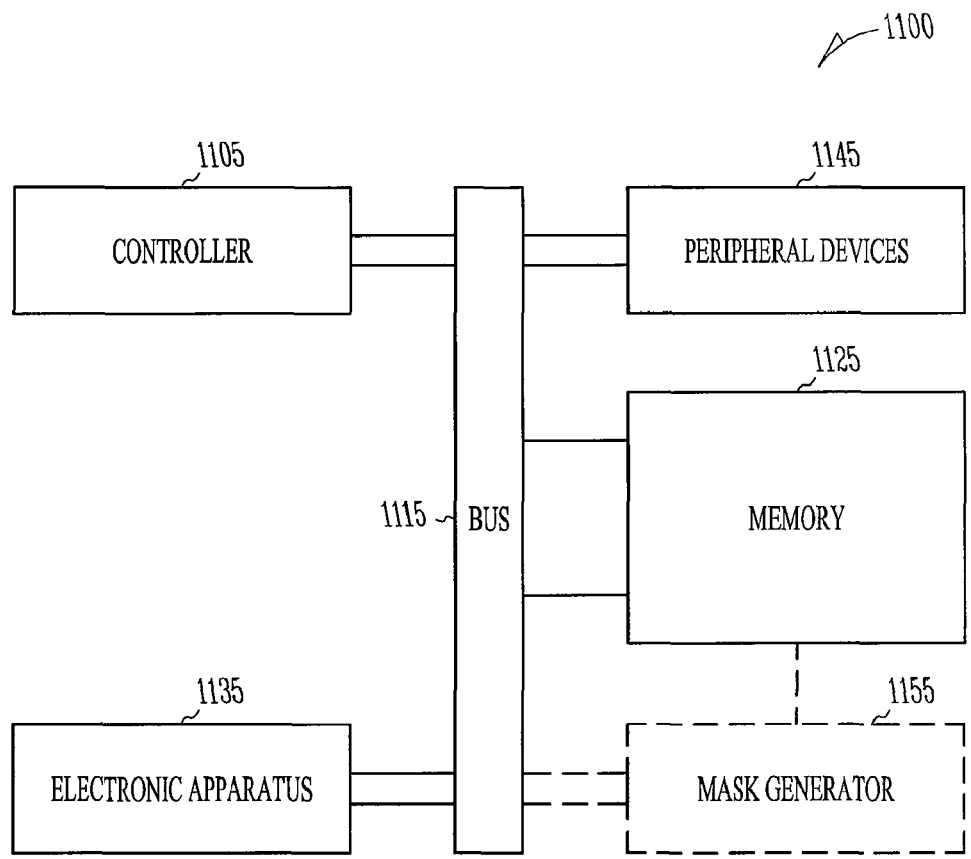
FIG. 11 shows a block diagram of a system having a controller and a mask generator to operatively access a portion of memory cells of a row of a memory array of a memory device without accessing all the memory cells of the row, according to various embodiments of the invention.

FIG. 11 shows a block diagram of a system 1100 having a controller 1105, a memory 1125, and a mask generator 1155. System 1100 may be formed in various ways such as coupling the individual components of system 1100 together or integrating the components into one or a number of units using conventional techniques. In an embodiment, system 1100 also includes an electronic apparatus 1135 and a bus 1115, where bus 1115 provides electrical conductivity between controller 1105 and electronic apparatus 1135 and between controller 1105 and memory 1125. In an embodiment, bus 1115 includes an address bus, a data bus, and a control bus, each independently configured. In an alternative embodiment, bus 1115 uses common conductive lines for providing one or more of address, data, or control, the use of which is regulated by controller 1105. In an embodiment, electronic apparatus 1135 includes additional memory configured in a manner similar to memory 1125.

Mask generator 1155 may be configured to receive a request from controller 1105 to access memory cells in a memory array of memory device 1125 and to generate a row mask address to memory device 1125. The row mask address may be arranged as an address of a portion of a row in the memory array, where the portion is less than the row in its entirety. In various embodiments, mask generator 1155 may be configured and may operate similar to, or identically to, mask generators discussed with respect to FIGS. 1-10. The row mask address may be provided, as mask bits in addition to a row address, to memory device 1125. Alternatively, with each portion of a row having its own address, mask generator 1155 may be configured to decode the request from controller 1105 and provide an appropriate row portion address to memory device 1125. Mask generator 1155 may be coupled to bus 115 to receive the request from controller 1105. Alternatively, mask generator 1155 may be integrated on a substrate with memory device 1002.

In an embodiment, additional peripheral device or devices 1145 are coupled to bus 1115. Peripheral devices 1145 may include displays, imaging devices, printing devices, wireless devices, additional storage memory, control devices that may operate in conjunction with controller 1105. In an embodiment, controller 1105 includes a processor. In various embodiments, system 1100 includes, but is not limited to, fiber optic systems or devices, electro-optic systems or devices, optical systems or devices, imaging systems or devices, and information handling systems or devices such as wireless systems or devices, telecommunication systems or devices, and computers.

In various embodiments, a method for forming a mask generator and/or a memory device to operate in conjunction with a mask generator, according to various embodiments, may include coupling the mask generator and/or memory device to other units to form a system. The mask generator and/or memory device may be coupled to a processor in a system. The construction of a system may include, but is not limited to, forming fiber optic systems or devices, forming electro-optic systems or devices, forming optical systems or devices, forming imaging systems or devices, and forming information handling systems or devices such as wireless systems or devices, telecommunication systems or devices, and computers.

In various embodiments, structures having a mask generator and/or a memory to operate in conjunction with a mask generator may be formed in other apparatus and may be formed in memory devices constructed as part of a system. Conventional techniques for memory devices and system may be implemented in forming various embodiments of a mask generator and/or a memory device to operate in conjunction with a mask generator and in forming systems constructed with a mask generator and/or a memory device to operate in conjunction with a mask generator, as described herein.

Figure 12:
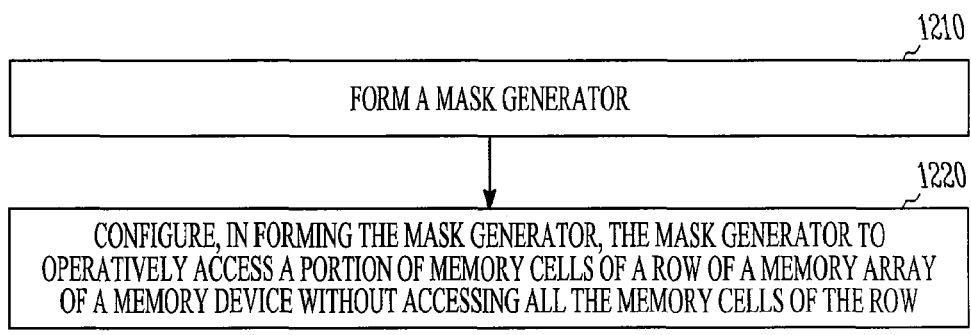
FIG. 12 illustrates features of a method that includes forming a mask generator configured to operatively access a portion of memory cells of a row of a memory array of a memory device without accessing all the memory cells of the row, according to various embodiments of the invention.

FIG. 12 illustrates features of a method that includes forming a mask generator configured to operatively access a portion of memory cells of a row of a memory array of a memory device without accessing all the memory cells of the row, according to various embodiments of the invention. At 1210, a mask generator is formed. At 1220, in forming the mask generator, the mask generator is configured to operatively access a portion of memory cells of a row of a memory array of a memory device without accessing all the memory cells of the row.

Figure 13:
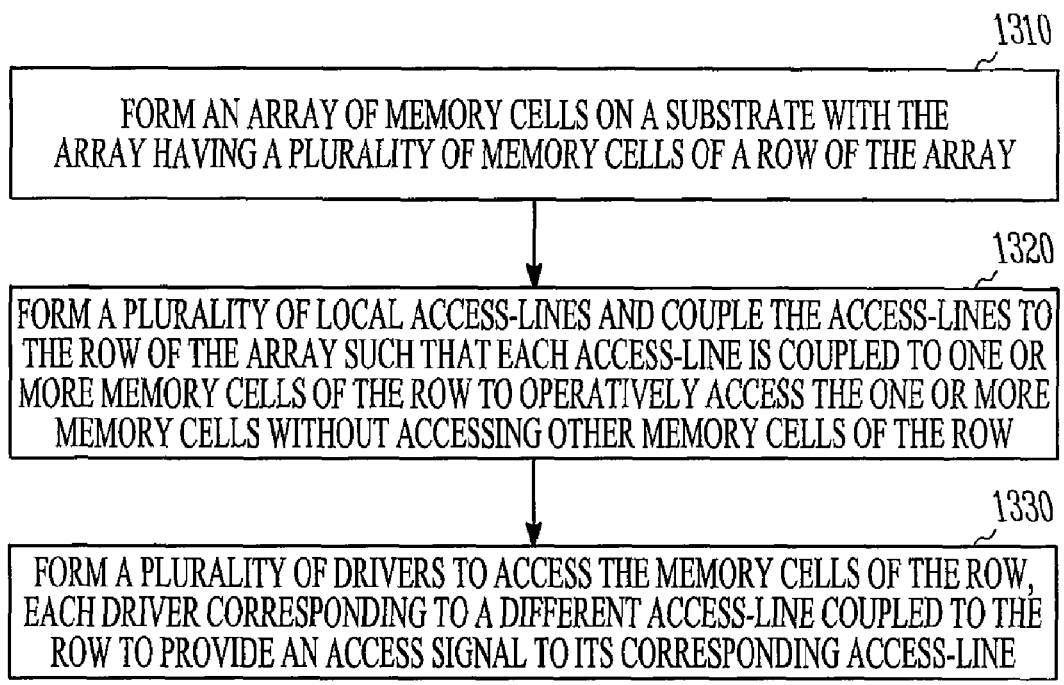
FIG. 13 illustrates features of a method that includes forming a memory on a substrate with an array of memory cells having a plurality of memory cells of a row of the array such that one or more memory cells of the row may be operatively accessed without accessing other memory cells of the row, according to various embodiments of the invention.

FIG. 13 illustrates features of a method that includes forming a memory on a substrate with an array of memory cells having a plurality of memory cells of a row of the array such that one or more memory cells of the row may be operatively accessed without accessing other memory cells of the row, according to various embodiments of the invention. At 1310, an array of memory cells is formed on a substrate with the array having a plurality of memory cells of a row of the array. At 1320, a plurality of local access-lines are formed and coupled to the row of the array such that each access-line is coupled to one or more memory cells of the row to operatively access the one or more memory cells without accessing other memory cells of the row. At 1330, a plurality of drivers is formed to access the memory cells of the row, where each driver corresponds to a different access-line coupled to the row to provide an access signal to its corresponding access-line.

Figure 14:
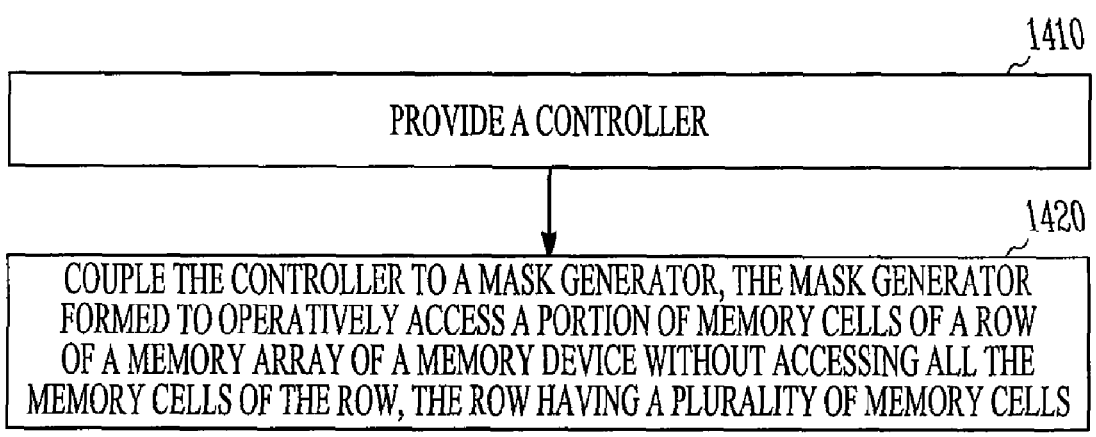
FIG. 14 illustrates features of a method that includes forming a system with a mask generator formed to operatively access a portion of memory cells of a row of a memory array of a memory device without accessing all the memory cells of the row, according to various embodiments of the invention.

FIG. 14 illustrates features of a method that includes forming a system with a mask generator formed to operatively access a portion of memory cells of a row of a memory array of a memory device without accessing all the memory cells of the row, according to various embodiments of the invention. At 1410, a controller is provided. At 1420, the controller is coupled to a mask generator, where the mask generator is formed to operatively access a portion of memory cells of a row of a memory array of a memory device without accessing all the memory cells of the row, where the row has a plurality of memory cells.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description and not of limitation.

What is claimed is:

1. A method comprising:
   accessing a portion of a plurality of memory cells of a row of a memory array using a row address mask generated in response to a request to access memory cells in the memory array such that a remaining portion of memory cells of the row stay un-accessed, the accessed portion including less than all the memory cells of the row, the remaining portion including operable memory cells.

2. The method of claim 1, wherein using a row address mask generated in response to a request comprises creating the row address mask substantially in real-time.

3. The method of claim 1, wherein the method comprises generating the row address mask based of a row address, a column address, and an amount of data to access responsive to the request.

4. A method comprising:
   accessing a portion of a plurality of memory cells of a row of a memory array using a row address mask generated in response to a request to access memory cells in the memory array such that a remaining portion of memory cells of the row stay un-accessed, the accessed portion including less than all the memory cells of the row, wherein the method comprises using the row address mask correlated to a plurality of local access-line drivers corresponding to the row such that one or more local access-line drivers of the plurality of local access-line drivers are not turned on when one or more other of the local access-line drivers for the row are turned on in response to the request.

5. A method comprising:
accessing a portion of a plurality of memory cells of a row of a memory array using a row address mask generated in response to a request to access memory cells in the memory array such that a remaining portion of memory cells of the row stay un-accessed, the accessed portion including less than all the memory cells of the row, wherein accessing a portion of memory cells of a row of a memory array using a row address mask comprises turning on a first set of local access-line drivers with a second set of local access-line drivers remaining off in response to the request, both the first set and the second set of local access-line drivers corresponding to the row.

6. The method of claim 5, wherein turning on a first set of local access-line drivers with a second set of local access-line drivers remaining off comprises maintaining more local access-line drivers for the row off than those that are turned on.

7. The method of claim 5, wherein the method comprises accessing a global access-line driver for the row.

8. An apparatus comprising:
a mask generator configured to receive a request to access memory cells in a memory array and to generate a row mask address, the row mask address including an address of a portion of a row, the portion including less than the row in its entirety, such that the generated row mask address is indicative of memory cells in the portion to be accessed while operable memory cells in the row not in the portion are to be un-accessed or the generated row mask address is indicative of operable memory cells in the portion to be un-accessed while memory cells in the row not in the portion are to be accessed.

9. The apparatus of claim 8, wherein the mask generator is configured to generate the row mask address substantially in real-time.

10. The apparatus of claim 8, wherein the request comprises a row address such that the generated row mask address is indicative of a set of portions of a row of the memory array, corresponding to the row address, not to access while other portions of the row, corresponding to the row address, are accessed.

11. The apparatus of claim 8, wherein the request comprises a row address such that the generated row mask address is indicative of a set of portions of a row of the memory array, corresponding to the row address, to access while other portions of the row, corresponding to the row address, remain un-accessed.

12. The apparatus of claim 8, wherein the request comprises a row address and the generated row mask address comprises an address orthogonal to the row address.

13. The apparatus of claim 8, wherein the row mask address is correlated to an amount of data to access.

14. The apparatus of claim 8, further comprising a processor, wherein the mask generator is separate from the memory array, separate from the processor, or separate from both the memory array and the processor.

15. The apparatus of claim 8, further comprising a processor, wherein the mask generator is located together with the memory array and/or the processor on an integrated circuit.

16. The apparatus of claim 8, wherein the mask generator is structured as a portion of a row address buffer that provides additional bits to mask the portion of the row from being accessed by an access of a corresponding global access-line.

17. The apparatus of claim 8, wherein the mask generator is structured as a portion of a row address decoder that provides additional bits to mask the portion of the row from being accessed by an access of a corresponding global access-line.

* * * * *